US012592294B2

(12) United States Patent

Ayyapureddi

(10) Patent No.: US 12,592,294 B2

(45) Date of Patent: Mar. 31, 2026

(54) APPARATUSES, SYSTEMS, AND METHODS FOR STORING ERROR INFORMATION AND PROVIDING RECOMMENDATIONS BASED ON SAME

(71) Applicant: Micron Technology, Inc., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 131 days.

(21) Appl. No.: 18/598,937

(22) Filed: Mar. 7, 2024

(65) Prior Publication Data

US 2024/0312547 A1 Sep. 19, 2024

Related U.S. Application Data

(60) Provisional application No. 63/490,052, filed on Mar. 14, 2023.

(51) Int. Cl.
| | |
|---|---|
| *G11C 29/00* | (2006.01) |
| *G11C 29/18* | (2006.01) |
| *G11C 29/42* | (2006.01) |
| *G11C 29/44* | (2006.01) |
| *G11C 29/52* | (2006.01) |

(52) U.S. Cl.
CPC .............. *G11C 29/18* (2013.01); *G11C 29/42* (2013.01); *G11C 29/44* (2013.01); *G11C 29/4401* (2013.01); *G11C 29/52* (2013.01)

(58) Field of Classification Search
CPC ......... G11C 29/18; G11C 29/42; G11C 29/44; G11C 29/52; G11C 29/4401; G11C 2029/1202

USPC .................................................... 365/185.09
See application file for complete search history.

(56) References Cited

U.S. PATENT DOCUMENTS

| | | | |
|---|---|---|---|
| 7,676,728 B2 | 3/2010 | Resnick et al. | |
| 8,687,421 B2 | 4/2014 | Avila et al. | |
| 8,949,685 B2 | 2/2015 | Joseph et al. | |
| 9,037,928 B2 | 5/2015 | Kleveland et al. | |
| 9,087,614 B2 | 7/2015 | Son et al. | |
| 9,786,386 B2 | 10/2017 | Strauss et al. | |
| 9,823,964 B2 | 11/2017 | Reed et al. | |
| 10,523,240 B2 * | 12/2019 | Goel ..................... | H03M 13/13 |

(Continued)

FOREIGN PATENT DOCUMENTS

| | | |
|---|---|---|
| CN | 118658501 A | 9/2024 |

OTHER PUBLICATIONS

U.S. Appl. No. 19/280,560 titled "Apparatuses, Systems, and Methods for Storing Error Information and Providing Recommendations Based on Same" filed Jul. 25, 2025, pp. all pages of the application as filed.

(Continued)

*Primary Examiner* — Ly D Pham

(74) *Attorney, Agent, or Firm* — Dorsey & Whitney LLP

(57) ABSTRACT

Per-row recent and/or baseline error information for word lines may be stored along the word lines in some examples. In some examples, baseline error information may be stored in a fuse array. In some examples, the baseline error information may be loaded from the fuse array to a memory array. In some examples, based on the recent and/or baseline error information, the memory device may provide a post-package repair recommendation.

7 Claims, 10 Drawing Sheets

(56) References Cited

U.S. PATENT DOCUMENTS

| | | | |
|---|---|---|---|
| 10,824,365 B2 | 11/2020 | Jung | |
| 12,400,728 B2 | 8/2025 | Ayyapureddi | |
| 12,437,829 B2 | 10/2025 | Ayyapureddi | |
| 2016/0110252 A1* | 4/2016 | Hyun | G06F 11/1044 |
| | | | 714/766 |
| 2018/0342299 A1 | 11/2018 | Yamada et al. | |
| 2019/0268018 A1* | 8/2019 | Brueggen | G11C 29/52 |
| 2021/0064462 A1 | 3/2021 | Eun et al. | |
| 2021/0286670 A1* | 9/2021 | Rooney | G06F 11/106 |
| 2022/0197740 A1* | 6/2022 | Rooney | G06F 11/1048 |
| 2023/0185473 A1* | 6/2023 | Choi | G06F 3/0652 |
| | | | 711/154 |
| 2023/0352112 A1* | 11/2023 | Ayyapureddi | G11C 29/52 |
| 2024/0281327 A1* | 8/2024 | Ayyapureddi | G06F 13/1673 |
| 2024/0312550 A1 | 9/2024 | Ayyapureddi | |
| 2024/0312553 A1 | 9/2024 | Ayyapureddi | |
| 2025/0349379 A1 | 11/2025 | Ayyapureddi | |

OTHER PUBLICATIONS

U.S. Appl. No. 18/598,832, titled "Apparatuses, Systems, and Methods for Storing Error Information and Providing Recommendations Based on Same", filed Mar. 7, 2024; pp. all pages of application as filed.

U.S. Appl. No. 18/598,899, titled "Apparatuses, Systems, and Methods for Storing Error Information and Providing Recommendations Based on Same", filed Mar. 7, 2024; pp. all pages of application as filed.

* cited by examiner

| | 17 Bits | 4 Bits |
|---|---|---|
| Command | Row Address | pRECS Value |
| Start | 34 | 0 |
| Start Bank | 35 | 0 |
| Bank Address | 0-32 | 0 |
| Stop Bank | 36 | 0 |
| Row Address | $0-2^{17}$ | Non Zero |
| Stop | 37 | 0 |
| Start PPR | 38 | 0 |
| PPR Address | $1, 0-2^{16}$ | Non Zero |
| Stop PPR | 39 | 0 |

FIG. 5

| | 17 Bits | 4 Bits |
|---|---|---|
| | Row Address | pRECS Value |
| Start | 34 | 0 |
| Start Bank | 35 | 0 |
| Bank Address | 0 | 0 |
| Row Address | 34 | 4 |
| Row Address | 78 | 7 |
| Stop Bank | 36 | 0 |
| Start Bank | 35 | 0 |
| Bank Address | 6 | 0 |
| Row Address | 36 | 5 |
| Row Address | 1026 | 6 |
| Stop Bank | 36 | 0 |
| Stop | 37 | 0 |
| | | |
| Start | 34 | 0 |
| Start PPR | 38 | 0 |
| Start Bank | 35 | 0 |
| Bank Address | 0 | 0 |
| Row Address PPR | 12 | 7 |
| Stop Bank | 36 | 0 |
| Stop PPR | 39 | 0 |
| Stop | 37 | 0 |

Analyzing a Value Indicating a Number of Code Words of a Word Line with Errors of a Memory Array of a Memory Device

704

Issuing a Post-package Repair (PPR) Recommendation

708

Providing an Active Alert Signal to an External Pin of the Memory Device

706

Storing the Row Address in a Register of the Memory Device

800

801

Receiving an Active Alert Signal from the Memory Device

802

Issuing, from a Controller to a Memory Device, a Mode Register Read Command

806

Issuing, from the Controller to the Memory Device, a PPR Command

804

Receiving, from the Memory Device, a Post Package Repair (PPR) Recommendation

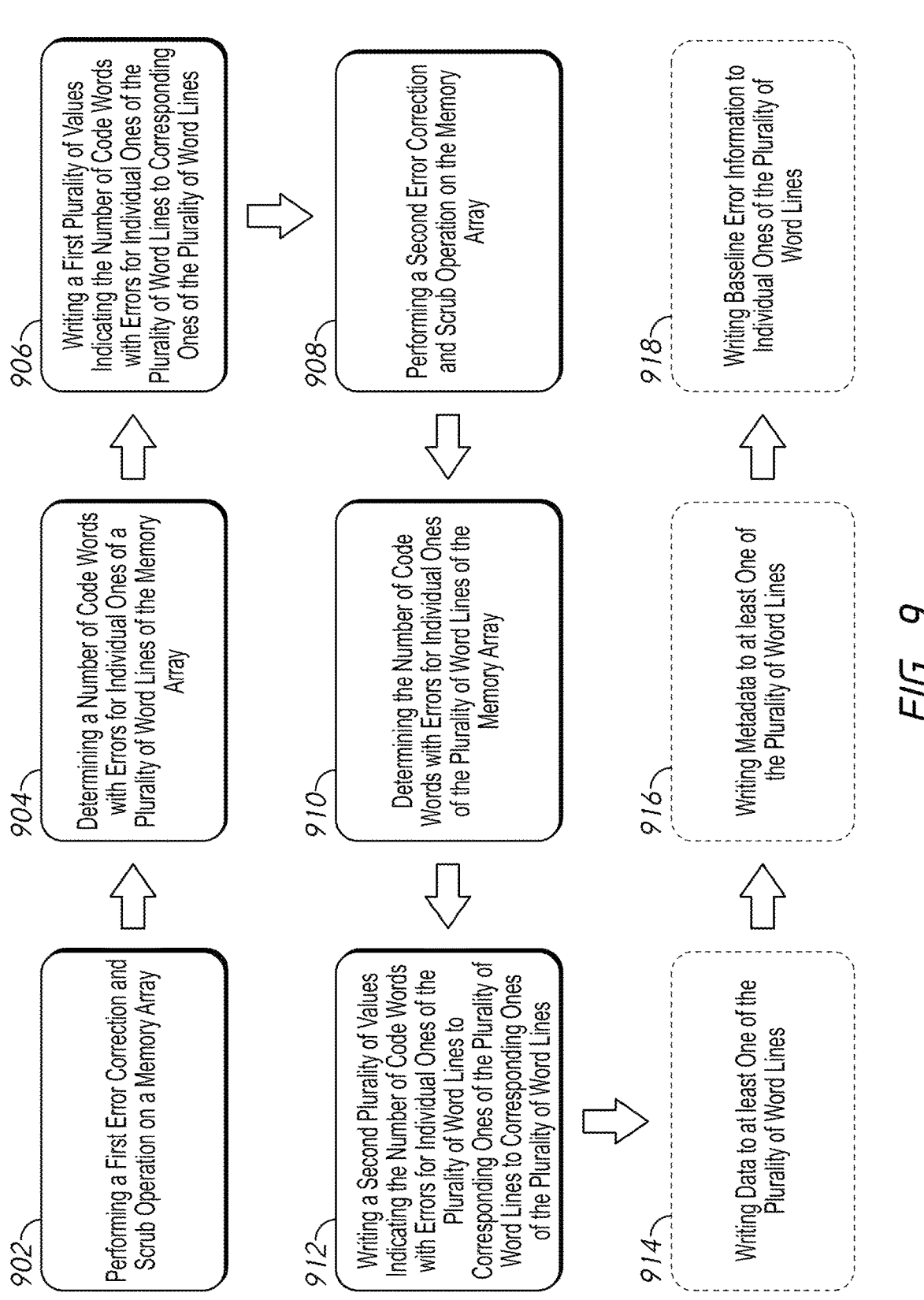

*FIG. 9*

902 — Performing a First Error Correction and Scrub Operation on a Memory Array

904 — Determining a Number of Code Words with Errors for Individual Ones of a Plurality of Word Lines of the Memory Array 906 — Writing a First Plurality of Values Indicating the Number of Code Words with Errors for Individual Ones of the Plurality of Word Lines to Corresponding Ones of the Plurality of Word Lines 908 — Performing a Second Error Correction and Scrub Operation on the Memory Array 910 — Determining the Number of Code Words with Errors for Individual Ones of the Plurality of Word Lines of the Memory Array 912 — Writing a Second Plurality of Values Indicating the Number of Code Words with Errors for Individual Ones of the Plurality of Word Lines to Corresponding Ones of the Plurality of Word Lines of the Plurality of Word Lines 914 — Writing Data to at least One of the Plurality of Word Lines 916 — Writing Metadata to at least One of the Plurality of Word Lines 918 — Writing Baseline Error Information to Individual Ones of the Plurality of Word Lines

1002

Reading Data from a Fuse Array of a Memory Device

1004

Decoding a Command, a Bank Address, a Row Address, and a Value from the Data with a Command Decoder

1008

Causing the Value to be Written to the Row Associated with the Row Address

1006

Providing, from the Command Decoder, the Row Address and the Value to a Bank Indicated by the Bank Address

APPARATUSES, SYSTEMS, AND METHODS FOR STORING ERROR INFORMATION AND PROVIDING RECOMMENDATIONS BASED ON SAME

CROSS REFERENCE TO RELATED APPLICATION(S)

This application claims the benefit under 35 U.S.C. § 119 of the earlier filing date of U.S. Provisional Application Ser. No. 63/490,052 filed Mar. 14, 2023, the entire contents of which are hereby incorporated by reference in their entirety for any purpose.

BACKGROUND

This disclosure relates generally to semiconductor devices, such as semiconductor memory devices. The semiconductor memory device may include a number of memory cells which are used to store information. The stored information may be encoded as binary data, and each memory cell may store a single bit of the information. Information may decay or change in the memory cells due to a variety of different errors, which may lead to one or more bits of incorrect information (e.g., bits with different states that the bit which was originally written) being read out from the memory device.

There may be many applications where it is useful to ensure a high fidelity of information read out from the memory. Memory devices may include error correction circuits, which may be used to determine if the information read out of the memory cells contains any errors compared to the data written into the memory cells, and may correct discovered errors. The memory device may periodically use the error correction circuits to repair errors in information stored within the memory array by scanning every memory cell of the memory array. However, present systems provide limited information on error correction and information on when repairs should be performed on memory devices.

BRIEF DESCRIPTION OF THE DRAWINGS

FIG. 5 shows an example grammar for programming the fuse array according to embodiments of the present disclosure.

FIG. 6 shows an example programming of a fuse array according to embodiments of the present disclosure.

FIG. 9 is a flow chart of a method according to embodiments of the present disclosure.

DETAILED DESCRIPTION

Figure 1:
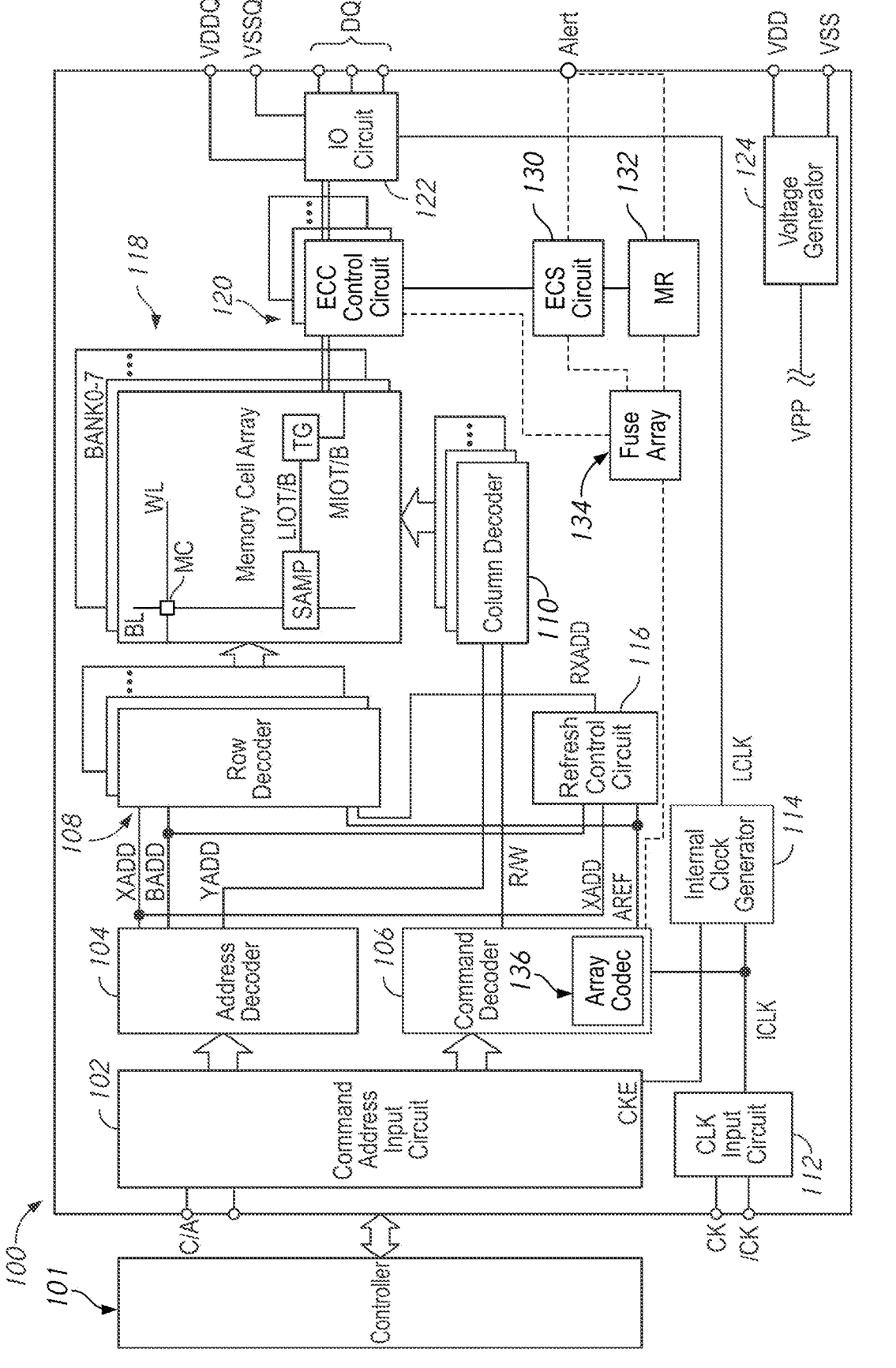
FIG. 1 is a block diagram of a semiconductor device according some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a memory array which has a number of memory cells, each located (e.g., disposed) at the intersection of a word line (row) and digit line (bit line, column). The memory array may be subdivided into banks, each of which includes a number of rows and a number of columns (the number of rows and number of columns need not be equal to one another). The columns may generally be organized into column planes, each of which includes a number of sets of individual columns all activated by a column select signal (CS). Each bank may include some number X column planes. A column plane may receive some number N of column select (CS) signals, each of which may activate some number M of individual digit lines. As used herein, a column select set or CS set may generally refer to a set of digit lines which are activated by a given value of the CS signal within a column plane. The column select signal may be represented by (all or a portion of) a column address (CA). Responsive to a column select signal, data may be provided from corresponding locations from the column planes. The data from the column planes associated with the column select signal may be referred to as a cache line and/or a prefetch.

During a read or write operation, a row may be activated, and data may be read from, or written to, the memory cells along the activated row. Each row may include memory cells which store a number of bits of data and a number of bits of parity information (e.g., data bits and parity bits), which may be used to correct up to a certain number of errors in the data bits. For example, a row may include one or more code words, each of which includes M data bits and K parity bits, which may be used to correct up to one of the M data bits or one of the K parity bits. During a write operation the parity bits may be generated by an error correction code (ECC) circuit based on the data written to the memory cells of the row. During a read operation the ECC circuit may use the parity bits to determine if the read data bits are correct, and may correct any errors which are found in the data as it is being provided off the memory device (e.g., to a controller). In some applications, the K parity bits (e.g., ECC information) for each row may be stored in memory cells along the same columns of the array. That is, certain column planes may be designated for the M data bits and other column planes may be designated for the K parity bits.

The ECC circuit may identify errors in read data and correct the read data before it is provided to data terminals of the memory device. However, the error may remain in the code word stored in the memory array. The device may perform error check and scrub (ECS) operations to remedy this. In an ECS operation, the address of each code word of the memory array may be accessed one at a time. The code word from the current address is read out, an error, if present, is corrected by the ECC circuit, and then the corrected code word is written back to the memory array. The memory performs an ECS cycle by performing ECS operations on each code word of the memory by working through a sequence of every code word address.

During an ECS cycle, the memory may collect information about the number of code words which contained an error. For example, the memory may report a total number of code words with errors and/or the address of the row which contains the most code word errors. However, more transparency into the number and location of errors in the memory array is desired, particularly in automotive and other fields where errors may lead to safety issues.

Typically, the parity bits may provide enough information to correct one error in the code word. If the code word includes two errors, a "collision" may occur. In some instances, the two errors may cause the ECC circuit to flip a bit during correction, which may introduce a third error in the code word. Some errors in the code word are transient. That is, the error was introduced by a temporary condition in the memory array (e.g., transient electromagnetic disturbance, temperature fluctuation, etc.) and/or a flaky bit. For transient errors, the next time the code word is written to the memory cell, it may not include an error. However, some errors in the code word are persistent. That is, the error is due to a defect in the memory device (e.g., defective memory cell, short in a conductive line coupled to a memory cell, etc.).

Memory arrays may be tested after fabrication prior to shipping to customers or end users to find defective rows and columns—that is, rows and columns with unacceptable numbers of errors. The unacceptable number may be based on a pre-determined threshold number of errors in a row and/or column. For example, each row may include sixty-four column selects, each associated with a code word for a total of sixty-four code words. If a row is found to have four or more code words with errors, the row may be flagged as defective. The threshold number of errors may be based, at least in part, on a risk of collisions occurring based on the number of detected errors. Defective rows and columns may be replaced by redundant rows and columns in the memory array. The addresses for the defective rows and columns may be remapped to the redundant rows and columns. The remapping information may be stored in a fuse array of the memory device.

After the memory device has left the factory, the memory array may be damaged and/or degrade over time, leading to more defective rows and/or columns. These additional defective rows and/or columns may be remapped to additional redundant rows and columns, respectively, by using post-package repair (PPR) functionality of the memory device. However, once all of the available redundant rows and/or columns have been used, no more defective rows or columns can be repaired.

The ECC circuit of a memory device may manage errors, such as parity checks during access operations and/or during ECS operations to avoid prematurely "using up" the available redundant rows and columns. However, some rows and/or columns may develop enough errors that the risk of a collision becomes unacceptably high. In these cases, a PPR operation may be appropriate to replace the defective row and/or column. Some users may not know when a PPR operation is advisable and may remap rows or bit lines with errors that may be reliably managed by the ECC circuit.

Accordingly, providing advice from the memory device as to when to perform a PPR operation may be desirable.

The present disclosure is directed to apparatuses, systems and methods for storing per-row error information (e.g., ECC and/or ECS information) in a memory device and to provide PPR recommendations. In some examples, error information may include a number of code words with errors in a row (e.g., a pRECS value). In some examples, error information may include addresses of bits with errors or addresses of code words with errors. In some embodiments, only error information for rows that have errors may be included in the baseline information. The error information may include "baseline" information and "recent" information. Baseline information may include error information of the memory array collected after fabrication (e.g., pRECS values found during testing) but prior to being provided to a user (e.g., customer of a memory device company or end user). Recent information may include error information (e.g., ECS information) from a number of most recent ECS cycles, error information from a number of most recent hours or days, etc.

Error information may be stored in various locations of a memory device. In some embodiments, baseline information may be stored in a fuse array of the memory device and recent information may be stored in a memory array. In some embodiments, recent information may be stored in the memory array, and some or all of the baseline information stored in the fuse array may be loaded into the memory array. In some embodiments, error information may be stored in regions of the memory array for metadata. In some embodiments, error information may be stored in regions of the memory array "leftover" after regions are assigned to metadata (e.g., "extra" bits in column planes assigned to store metadata).

In some embodiments, the memory device may compare the recent information to the baseline information. If the comparison indicates a word line or a bit line has become defective (e.g., the recent information indicates an increase in the number of code words with errors compared to the baseline information), the memory device may issue a recommendation to perform a PPR operation.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP). Read data from the bit line BL is amplified by the sense amplifier SAMP, and transferred to read/write amplifiers 120 over complementary local data lines (LIOT/B), transfer gate (TG), and complementary main data lines (MIOT/B) which are coupled to an error correction code (ECC) control circuit 120. Conversely, write data outputted from the ECC control circuit 120 is transferred to the sense amplifier SAMP over the complementary main data lines MIOT/B, the transfer gate TG, and the complementary local data lines LIOT/B, and written in the memory cell MC coupled to the bit line BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. In some embodiments, the memory addresses may be provided by a controller, such as controller 101. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. In some embodiments, the memory addresses may be provided by the controller 101. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, a code word including read data and read parity bits is read from memory cells in the memory array 118 corresponding to the row address and column address. The read command is received by the command decoder 106, which provides internal commands so that read data from the memory array 118 is provided to the ECC control circuit 120. The ECC control circuit 120 may use the parity bits in the code word to determine if the code word includes any errors, and if any errors are detected, may correct them to generate a corrected code word (e.g., by changing a state of the identified bit(s) which are in error). The corrected code word (without the parity bits) is output to outside the device 100 from the data terminals DQ via the input/output circuit 122.

The device 100 may receive an access command which is a write command. When the write command is received, and a bank address, a row address, and a column address are timely supplied as part of the write operation, and write data is supplied through the DQ terminals to the ECC control circuit 120. The write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the ECC control circuit 120. The ECC control circuit 120 may generate a number of parity bits based on the write data, and the write data and the parity bits may be provided as a code word to the memory array 118 to be written into the memory cells MC.

The ECC control circuit 120 may be used to ensure the fidelity of the data read from a particular group of memory cells to the data written to that group of memory cells. The device 100 may include a number of different ECC control circuits 120, each of which is responsible for a different portion of the memory cells MC of the memory array 118. For example, there may be one or more ECC control circuits 120 for each bank of the memory array 118.

Each ECC control circuit 120 may receive a code word which includes a certain number of data bits and a certain number of parity bits (e.g., 128 data bits and 8 parity bits). The data bits may be provided from either from the IO circuit 122 or the memory array 118 depending on if it is a read or write operation, and the ECC control circuit 120 uses the parity bits (e.g., ECC information) to locate and correct potential errors in the code word. For example, as part of a write operation an ECC control circuit 120 may receive 128 bits of data from the IO circuit 122 and may generate 8 parity bits based on those 128 data bits to form a code word with 136 total bits. The code word may be written to the memory array 118. In some embodiments, the data bits may be written to column planes configured to store the data and the eight bits of ECC information (e.g., parity bits) may be written to a column plane configured to store the ECC information. As part of an example read operation, the ECC control circuit 120 may receive a code word with 128 data bits and 8 parity bits from the memory cell array 118. In some embodiments, the data bits may be retrieved from the data column planes and the ECC information may be retrieved from the ECC column plane. The ECC control circuit 120 may generate new parity bits from the 128 data bits, and then compare the new parity bits to the read parity bits in the code word to generate syndrome bits. The syndrome bits may be used to locate errors in the code word and the ECC control circuit 120 and may correct them if any are found before supplying the data bits to the IO circuit 122. While various embodiments may be discussed with reference to ECC circuits which use code words where eight parity bits are used to find one error in 128 data bits, it should be understood that these are for explanatory purposes only, and that other numbers of data bits, error bits, and parity bits may be used in other example embodiments.

During a read operation, the ECC control circuit 120 checks the code word and locates and corrects any errors before providing the corrected code word to the IO circuit 122. Accordingly, if there was an error, it may remain in the code word stored in the memory array 118 since the correction is made between the memory array 118 and the IO circuit 122. The memory device 100 includes error check and scrub (ECS) circuit 130, which is used to correct errors stored within the memory array 118. Over the course of an ECS cycle, the ECS circuit 130 generates a sequence of addresses (e.g., a sequence of row addresses and a sequence of column addresses), which cover all the code words stored in the memory array 118. For each address in the sequence, the ECS circuit 130 operates the address decoder 104 and command decoder 106 to perform a read operation on the memory cells of that address, and then instead of providing the corrected code word off the device 100 as in a normal read, the corrected code word is written back to the memory array 118. In some embodiments, only a portion of the code word (e.g., only the data bits or only the data bit changed by the correction) may be written back to overwrite the previous code word. By cycling through a sequence of addresses which includes all code words, the ECS circuit 130 may perform an ECS cycle to repair the errors in the memory cells array 118.

The ECS circuit 130 may perform an ECS cycle based on a manual or auto mode. In a manual mode, the ECS circuit 130 may receive a command (e.g., a multi-purpose command or MPC) and may perform an ECS operation responsive to that command. In an auto mode, the ECS circuit 130 may use internal logic and timing to carry out ECS operation. For example, the ECS circuit 130 may perform ECS operations during refresh operations. The ECS circuit 130 may have a specified time over which to complete the sequence of addresses (e.g., to perform the ECS cycle). For example, the memory device 100 may specify 12, 24, or 48 hours to complete a sequence of ECS operations which includes all code words in the memory array 118. The ECS circuit 130 may perform a read, correct, and write ECS operation on each address in the sequence such that the sequence is completed over the course of the specified period. Accordingly, the average timing between individual ECS operations may be specified by the total number of code words in the memory array 118 and the length of time in which the ECS cycle should be performed.

The ECS circuit 130 collects information about the errors which are located. The device 100 may record per-row ECS information (e.g., per-row error information) when a per-row ECS mode is enabled. The per-row ECS mode may be enabled by a setting in the mode register 132. For example, each row of the memory array 118 may include a number of code words. When the pRECS mode is enabled, the ECS circuit 130 may generate a count for each row which indicates how many code words on that row included an error during the most recent ECS cycle. For example, the ECS circuit 130 may include a per-row ECS register. During the ECS cycle, the ECS circuit 130 may generate a row address, and then perform an ECS operation on each code word of that row address (e.g., by generating column addresses in sequence) before moving on to a next row. During that process, if an error is detected and a pRECS mode is enabled, the value in the per-row ECS register may be updated (e.g., incremented). Once all the code words along the current row are checked (e.g., when the column address wraps back around to an initial value), the value in the per-row ECS register may be stored, and the per-row ECS register reset to an initial value (e.g., 0).

In some embodiments, there may be multiple per-row ECS registers, such as a per-row ECS register for each bank. Multiple per-row ECS registers may be used because ECS operations may be dispersed between different banks (e.g., an ECS operation in a first bank may be followed by an ECS operation in a second bank before a second ECS operation in the first bank occurs). Accordingly, each per-row ECS register may track a number of errors along a current row for each bank.

In some embodiments, the ECS circuit 130 may store the per-row ECS information on the row associated with that per-row ECS information. For example, a set of memory cells along the row may be set aside to be used as storage for per-row ECS information. In some embodiments, which memory cells are set aside may be a setting of the mode register 132. For example, a column select (CS) signal value may specify the bit lines which intersect the set aside memory cells along each row, and that value of the CS signal may be stored in the mode register 132. In some embodiments, the bit lines may be located in column planes and/or associated with column selects in column planes configured to store metadata. Other methods of designating memory cells along the rows to store the per-row ECS information may be used in other examples.

In some embodiments, the per-row ECS information stored in the memory array for each row may include recent error information. The recent error information may include the error information (e.g., the number of errors and/or number of code words with errors) from the most recent ECS cycle as well as the error information from a certain number of previous ECS cycles (e.g., the most recent five ECS cycles, all of the ECS cycles performed within the last three days). Thus, in some embodiments, each row may store multiple per-row ECS information values (e.g., multiple values indicating the number of code words with errors).

Optionally, the device 100 may also generate overall ECS information such as overall readouts. In some embodiments, such overall ECS information may be provided to the mode register 132. For example, overall ECS information may include a total number of errors corrected in a portion of the device 100, a row with a maximum number of errors, and/or a number of errors in the row with the maximum number of errors. Examples of overall ECS information are described in U.S. patent application Ser. No. 17/730,396 filed on Apr. 27, 2022, which is incorporated herein by reference for any purpose.

In some embodiments, the device 100 may store baseline error information. For example, the baseline error information may include per-row error information, such as the number of code words with errors, a number of bits with errors, and/or other error information. The baseline error information may have been acquired during testing of the device 100, which may have occurred prior to shipping the device 100 from the manufacturer and/or prior to shipping the device 100 to an end user. In some embodiments, the baseline error information may be stored in a fuse array 134. The fuse array 134 may include multiple fuses or antifuses that can be set to store the baseline information. While shown as a separate component in FIG. 1, in other embodiments, the fuse array 134 may be included in another component of device 100. For example, the fuse array 134 may be included in the mode register 132 and/or a global redundancy management circuit (not shown). In some embodiments, the fuse array 134 may include additional information such as values to be written to the mode register 132 and/or mapping information for redundant rows (e.g., redundant rows used to replace "regular" word lines after a PPR operation).

In some embodiments, the baseline information may be copied from the fuse array 134 and stored in the memory array 118. In some embodiments, the fuse array 134 may be encoded with a number of errors in a row, a number of code words with errors in a row, and the row address. In some embodiments, the fuse array 134 may be encoded with additional information to facilitate writing the error information to the correct rows of the memory array 118. In some embodiments, the copying of the baseline information to the memory array 118 may be facilitated by a state machine implemented, at least in part, by a command decoder. In some embodiments, the state machine may be included in each bank (not shown). In some embodiments, the command decoder 106 may decode the content of the fuse array 134 to extract the error information and addresses to be written to the memory array 118. In some embodiments, the command decoder 106 may include a command decoder 136 ("array codec") specific for decoding the fuse array 134. In some embodiments, the array codec 136 may be a separate component from the command decoder 106. In some embodiments, the baseline information may include per-row information and the baseline information may be stored in memory cells along the applicable row. The baseline information may be stored in a portion of at least one column plane configured to store metadata. However, in other embodiments, the baseline information may be stored in other regions of the memory array (e.g., a column plane including redundant columns, column plane dedicated to per-row ECS data). In some embodiments, the baseline information may be copied from the fuse array 134 to the memory array 118 during power-up of the device 100.

In some embodiments, the controller 101 may read the ECS data and/or baseline information from the memory array 118. In some embodiments, the ECS data and/or baseline data stored in the memory array 118 and/or fuse array 134 may not be accessible to the controller 101. In some embodiments, certain ECS data, such as the overall ECS data that is provided to the mode register 132 may be accessible to the controller 101. In some applications, restricting access to per-row ECS information and/or other error information may reduce the risk of weaknesses in the device 100 from being exploited. In some embodiments, the level of access the controller 101 has to the error information may be set by programming a fuse array of the mode register 132.

In some embodiments, the ECS circuit 130 may analyze error information and make a post-package repair (PPR) recommendation. That is, the ECS circuit 130 may provide a signal to indicate that a row should be remapped to a redundant row to repair the row. In some embodiments, the ECS circuit 130 may analyze the per-row ECS information and/or the baseline information to make the PPR recommendations. For example, if the most recent ECS information indicates a number of code words with errors or a total number of errors along a row is equal to or greater than a threshold value, the ECS circuit 130 may provide a signal indicating the row should be repaired. In another example, if an increase in errors between a number of errors in a most recent count and a previous count is equal to or greater than a threshold value, the ECS circuit 130 may recommend PPR for the row. In a further example, if an increase in errors between a number of errors in a most recent count and a count from the baseline information is equal to or greater than a threshold value, the ECS circuit 130 may recommend PPR for the row. Other analysis of the recent and baseline error information are also possible. For example, if an average number of errors in the recent error information is greater than the baseline information, the ECS circuit 130 may recommend PPR for the row. In another example, if each error count for a row of a consecutive number of recent ECS cycles are each greater than the error count of the previous ECS cycle, the ECS circuit 130 may recommend PPR for the row. In some embodiments, the technique and/or threshold values used by the ECS circuit 130 to determine whether a PPR is recommended may be programmed into the device 100, for example, by programming the mode register 132.

In some embodiments, the ECS circuit 130 may provide the PPR recommendation by providing the row address of the row to be repaired to a register of the mode register 132. The controller 101 may periodically check the mode register 132 for PPR recommendations. In some embodiments, the ECS circuit 130 and/or the mode register 132 may provide an active alert signal to an external pin that notifies the controller 101 that the mode register 132 should be checked for a PPR recommendation. In some embodiments, such as the one shown in FIG. 1, the external pin may be a dedicated alert pin. In other embodiments, the external pin may be a multi-purpose pin or a sideband bus. In some embodiments, the ECS circuit 130 may provide the recommendation as soon as it determines a row should be repaired. In other embodiments, the ECS circuit 130 may provide a recommendation or multiple recommendations after the ECS cycle has been completed.

The controller 101 may issue a mode register read command (either periodically or responsive to an active signal on an external pin) to the device 100. In some embodiments the mode register read command may indicate a register within the mode register 132 that stores the PPR recommendation. The PPR recommendation provided from the mode register 132 to the controller 101 may include a row address of the row (or row addresses of rows) that the ECS circuit 130 has determined should be repaired. In some embodiments, the controller 101 may issue a PPR command to the device 100 to cause the device 100 to perform a PPR operation to repair the row indicated by the row address.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116. The refresh control circuit 116 supplies a refresh row address RXADD to the row decoder 108, which may refresh one or more wordlines WL indicated by the refresh row address RXADD.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
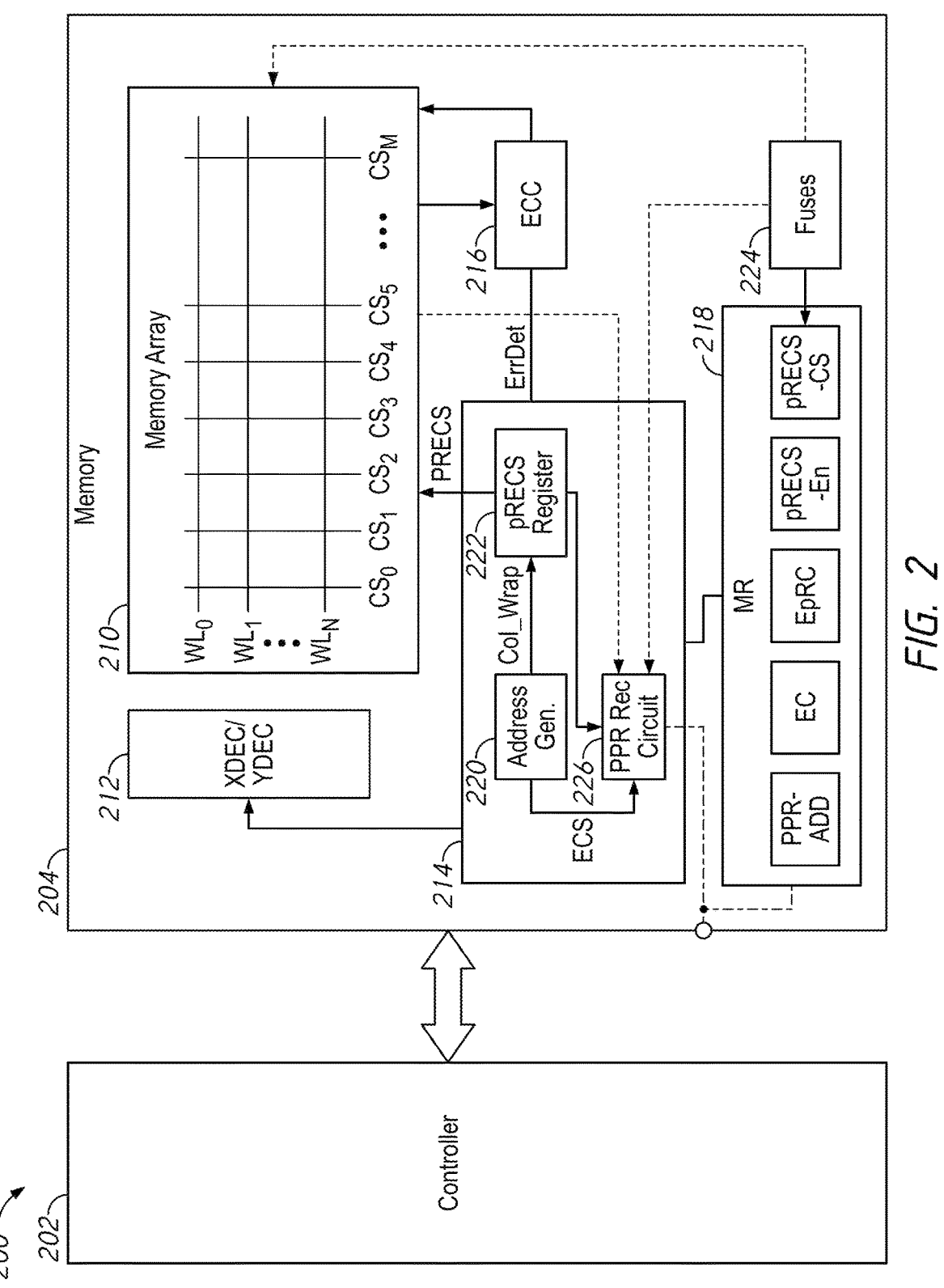
FIG. 2 is a block diagram of a memory system according to some embodiments of the present disclosure.

FIG. 2 is a block diagram of a memory system according to some embodiments of the present disclosure. The system 200 includes a controller 202 and a memory 204. The memory 204 may be included in device 100 in some embodiments. In some embodiments, the controller 202 may be included in controller 101. The memory system 200 illustrates a memory which generates and store per-row ECS information and an example controller which may be used to retrieve the per-row ECS information (if such permission is granted).

The memory 204 includes an ECS circuit 214 which manages ECS operations. In some embodiments, the ECS circuit 214 may be included in ECS circuit 130. The ECS circuit 214 includes an address generator 220 which over the course of an ECS cycle generates addresses for each code word in the memory array 210. In some embodiments, the memory array 210 may be included in memory array 118. For example, the ECS circuit 214 may provide a row and column address (an ECS address), and then update (e.g., increment) the column address, and continue until all column addresses along the row have been provided (e.g., the column address wraps back to an initial value), the ECS circuit 214 may then update (e.g., increment) the row address and repeat the process. The ECS circuit may continue generating ECS addresses until addresses associated with all code words have been provided over the course of an ECS cycle. The current ECS address may be provided to row and column decoders 212, along with commands (such as read-modify-write commands, not shown) such that for each address, the code word associated with the current address is read out to the ECC circuit 216, corrected (if necessary), and the corrected code word written back to the location specified by the current address. The ECS address may then be updated. The ECC circuit 216 may be included in ECC circuit 120 in some embodiments.

The ECC circuit 216 may provide an error detected signal ErrDet to the ECS circuit 214. The signal ErrDet may be active each time the ECC circuit 216 detects an error in the code word read from the memory array 210 as part of an ECS operation. The ECS circuit 214 includes a per-row ECS (pRECS) register 222. When a pRECS mode is enabled, the pRECS register 222 may change (e.g., increment) a stored count value each time the ErrDet signal is active, and reset to an initial value (e.g., 0) each time the address generator 220 indicates that a column address has wrapped back to a new value (e.g., each time a final column address along a row has been provided). For example, after the final column address has been generated, the address generator 220 may provide a column wrap signal Col_Wrap, and update the row address to a new value. Responsive to the signal Col_Wrap, the pRECS register 222 may write its current value to memory cells of the memory array 210 and reset the stored count value (e.g., to 0). For example, the count value in the pRECS register 222 may be written to memory cells along the current row (e.g., before the row address is updated responsive to Col_Wrap). In this manner, the pRECS value for each row may represent a number of code words along that row which contained an error (e.g., a number of times ErrDet was active for each value of the row address portion of the ECS address). In some embodiments, each row may store multiple pRECS values, where each pRECS value is a value from a different ECS cycle. In some embodiments, the pRECS values are from sequential ECS cycles. In some embodiments, there may be a pRECS register 222 for each bank, and each bank may separately generate row and column addresses for ECS operations.

The memory array 210 may be organized in rows and columns. Each row may be specified by a row address (e.g., XADD) which specifies a word line. For example, the address generator 220 may generate a first row address XADD, and responsive to that, the row decoder 212 may activate a first word line (e.g., $WL_0$) of the memory array 210. The columns along the activated row are accessed by a column address, which is decoded to activated column select signals CS. While each column select signal is shown with a single bit line, each CS signal may activate multiple individual bit lines. For example, a given CS signal may activate 8 bit lines in each of 17 column planes of the memory array, for a total of 136 active bit lines, and 136 bits (128 data bits and 8 parity bits). In some embodiments, additional bit lines may be activated, such as when the memory array 210 is enabled to store metadata that is protected by the ECC circuit 216 (e.g., 128 data bits, 1-8 metadata bits, and 8 parity bits). Accordingly, the address generator 220 may generate a row address, then as part of a first ECS operation provide a first column select signal, then as part of a second ECS operation provide a second column select signal and so forth.

In some embodiments, the per-row ECS information may be saved in the memory array 210. In some embodiments, the per-row ECS information may be saved in memory cells along the row which the per-row ECS information is associated with. For example, one or more values of the column select signal (and their corresponding memory cells) may be set aside for storing per-row ECS information. The mode register 218 may be used to designate a value pRECS-CS, a value (or values) of the CS signal set aside for per-row ECS information. However, in some embodiments, one or more of the CS signals may be shared between per-row ECS information and metadata. For example, as noted, each CS signal may active eight bit lines per column plane. However, not all eight bits in all of the column planes may be needed based on the amount of metadata desired. Thus, the unused or "leftover" bits associated with the CS signals for metadata may be used for storing per-row ECS information. Thus, some of the CS signals may be the same (e.g., shared)

between the bit lines associated with metadata and the bit lines associated with error information.

When the address generator 220 is generating ECS addresses, the address in pRECS-CS may be skipped, since it does not contain a code word with correctable data. For example, if pRECS-CS designates a column select value $CS_M$, then the address generator 220 may set a row address and provide column addresses $CS_0$ to $CS_{M-1}$, but not provide $CS_M$. However, in other embodiments, columns including the pRECS values and/or baseline information stored in the rows may also be included in one or more code words and checked for errors. The address generator 220 may then provide the signal Col_Wrap when the column address is updated as it may return to a value of $CS_0$. Responsive to the signal Col_Wrap, the ECS circuit 214 may provide the value of the pRECS register 222 as data along with the row address and the column address which activates the value in the pRECS-CS (e.g., $CS_M$) and a write command to write the value in the pRECS register 222 to the memory cells accessed by the value in the pRECS-CS register.

In some embodiments, the mode register 218 may be included in mode register 132. The mode register 218 may store various values which are related to the ECS operation. For example, the present disclosure describes an EC register and an EpRC register, although different, more, or fewer registers are possible in other examples. Each register may store various values associated with a respective counter in the ECS circuit 214. For example, the EC register may represent a number of code words with errors which were detected in the previous ECS cycle. The EC register may represent a raw count value, or may represent a range in which the count value falls. For example, a first value of the EC register may represent that the count is below the threshold, a second value of the EC register may represent that the count is between the threshold and a first count value, a third value of the EC register may represent that the count is between the first count value and a second count value etc. The EpRC register may store both a count value and a row address associated with the row which contained the most code word errors.

The mode register 218 includes a per-row ECS enable register pRECS-En. The register pRECS-En stores a value which indicates if the pRECS mode is enabled for the memory 204. If the pRECS-En register stores an inactive pRECS-En value, then the pRECS mode may be disabled, and the memory 204 may not collect pRECS information. For example, the pRECS register 222 may not respond to the ErrDet signal. In some embodiments, even the pRECS register 222 contains an inactive value, other ECS information, such as EC and EpRC may still be collected. In some embodiments, different ECS information as well as the ECS functionality may be separately enabled by one or more respective registers (not shown) of the mode register 218. In some embodiments, a controller 202 may set a value in the pRECS-En register to determine if pRECS information is collected or not. In some embodiments, the value of pRECS-En may be a memory 204 setting (e.g., programmed in a fuse array 224) which may have a value which is independent of the controller 202.

The mode register 218 may also include a pRECS address register, pRECS-CS, which specifies which memory cells are used to store the per-row ECS information. For example, the pRECS-CS register may store a value of the CS signal which specifies memory cells which have been designated for use for storing pRECS. Other information used for designating memory cells may be used in other example embodiments. In some embodiments, the pRECS-CS may store a value which is programmed in the fuse array 224. For example, the pRECS-CS value may be programmed into the fuse array 224 and then loaded into the pRECS-CS register of the mode register 218. In this way, once programmed the pRECS address may be programmed into the memory 204 in a manner which is a permanent setting of the memory 204. In some embodiments, the fuse array 224 may store additional information, such as baseline error information and/or may include multiple fuse arrays.

The per-row error information may further include baseline information. For example, the baseline information may include pRECS values from an initial ECS cycle during testing of the memory 204 (e.g., by the manufacturer). In some embodiments, the baseline pRECS values may be stored in a similar manner to the recent pRECS values (e.g., from the most recent ECS cycles performed by the memory 204). For example, the baseline information may be stored in memory cells along each row associated with CS values associated with pRECS data and/or the baseline information may be stored in "leftover" memory cells of metadata regions. In some embodiments, the baseline information may have been copied to the memory array 210 from a fuse array (e.g., fuse array 134 and/or fuse array 224). Alternatively, in some embodiments, the baseline information may remain in the fuse array and retrieved from the fuse array by the ECS circuit 214.

The ECS circuit 214 may include a PPR recommendation circuit 226 which may analyze error information and make a PPR recommendation. The PPR recommendation circuit 226 may provide a signal to indicate that a row should be remapped to a redundant row to repair the row. In some embodiments, PPR recommendation circuit 226 may analyze the pRECS values and/or the baseline information to make the PPR recommendations. The pRECS values for the recent and/or baseline error information may be received directly from the memory array 210 and/or the pRECS register 222. In some embodiments, the pRECS values for the baseline error information may be received from a fuse array.

The PPR recommendation circuit 226 may provide the PPR recommendation by providing the row address of the row to be repaired to a register PPR-ADD of the mode register 218. The address may be received from the address generator 220 in some embodiments. The controller 202 may periodically check the PPR-ADD register for PPR recommendation(s). In some embodiments, the PPR recommendation circuit 226 and/or the mode register 218 may provide an active alert signal to an external pin that notifies the controller 202 that the PPR-ADD should be checked for a PPR recommendation. In some embodiments, the PPR recommendation circuit 226 may provide the recommendation as soon as it determines a row should be repaired. For example, it may analyze data associated with each row as it becomes available from the pRECS register 222 during the ECS operation. In other embodiments, the PPR recommendation circuit 226 may provide a recommendation or multiple recommendations after the ECS cycle has been completed. In some embodiments, the PPR recommendation circuit 226 may provide recommendations as soon as it determines a row should be repaired, but the alert signal may not be activated until the end of the ECS operation. In some embodiments, the register PPR-ADD may store multiple row addresses. This may reduce the risk that a row address associated with a PPR recommendation will be overwritten by a new recommendation before being retrieved by the controller 202.

The PPR recommendation circuit 226 may determine a row should be repaired by any suitable technique. For example, in some embodiments, a PPR recommendation may be made when a number of code words with errors or a total number of errors along a row is equal to or greater than a threshold value or if an increase in errors between a number of errors in a most recent count and a previous count is equal to or greater than a threshold value. In another example, if an increase in errors between a number of errors in a most recent count and a count from the baseline information is equal to or greater than a threshold value, a PPR recommendation may be made. Other analysis of the recent and baseline error information including the pRECS values are also possible. For example, if an average number of errors in the recent error information is greater than the baseline information or if each error count for a row of a consecutive number of recent ECS cycles are each greater than the error count of the previous ECS cycle, a PPR recommendation may be made. In some embodiments, the technique and/or threshold values used by the PPR recommendation circuit 226 to determine when to make a PPR recommendation may be programmed into the mode register 218 and/or fuses 224.

The controller 202 may issue a mode register read command (either periodically or responsive to an active signal on an external pin) to the memory 204 in order to read the register PPR-ADD. In some embodiments, the controller 202 may issue a PPR command to the memory 204 to perform a PPR operation to repair the row indicated by the row address(es) read from the register PPR-ADD.

In some embodiments, the controller 202 may read the recent and/or baseline ECS information from the memory 204. In some embodiments, the recent and/or baseline ECS information may not be accessible to the controller 202. In some embodiments, certain ECS data, such as the overall ECS data such as EC and EpRC stored in mode register 218 may be accessible to the controller 202. Further, in some embodiments, such as when pRECS-En is enabled, write commands to memory cells corresponding to the per-row ECS data (recent and/or baseline) may be inhibited. This may prevent unintentional overwriting of the ECS data.

Figure 3:
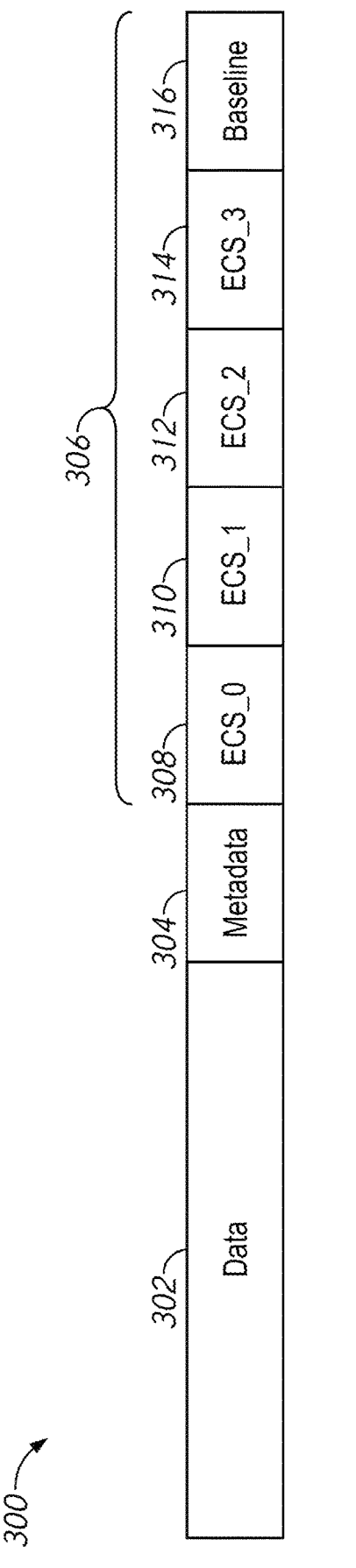
FIG. 3 is a block diagram of a row of a memory array according to embodiments of the present disclosure.

FIG. 3 is a block diagram of a row of a memory array according to embodiments of the present disclosure. The row 300 may be included in a memory array, such as memory array 118 and/or memory array 210. In some embodiments, row 300 may be included in a bank of a memory array. Row 300 may include multiple memory cells for storing data. A portion of the memory cells may store user data (e.g., data provided by a controller or other external device) as indicated by block 302. Other memory cells may store other types of data such as metadata as indicated by block 304 and error information indicated by block 306 for the row. Some memory cells may include recent error information and some memory cells may include baseline error information. In the example shown in FIG. 3, the memory cells may store multiple values ECS_0, ECS_1, ECS_2, ECS_3 related to recent error information (e.g., pRECS values from different ECS cycles) as indicated by blocks 308, 310, 312, and 314. In some embodiments, each value may be six bits, and each block 308, 310, 312, and 314 includes six memory cells. However, other numbers of bits (e.g., four, eight) may be used depending on what error information is stored for the row. While four values are shown in FIG. 3, in other embodiments, more or fewer values corresponding to recent error information may be included in the row 300. The baseline error information indicated by block 316 may include a pRECS value from an ECS cycle and/or other error detection operation performed.

In some embodiments, different column select signals (CS) may be associated with the different blocks of memory cells (e.g., different CS assigned to data block 302 and metadata block 304). However, in some embodiments, the same column select signals may be assigned to different blocks. For example, the same CS may be assigned to metadata block 304 and error information block 306, but different column planes may store the metadata block 304 and error information block 306. That is, the columns planes storing the metadata and the column planes storing the error information may be mutually exclusive.

It is noted that the blocks representing memory cells and their contents shown in row 300 are for explanatory purposes only, and the sizes of the blocks do not necessarily accurately represent the relative number of memory cells in each block. Further, the locations of the different types of data in the row 300 are not limited to the arrangement shown in FIG. 3.

Figure 4:
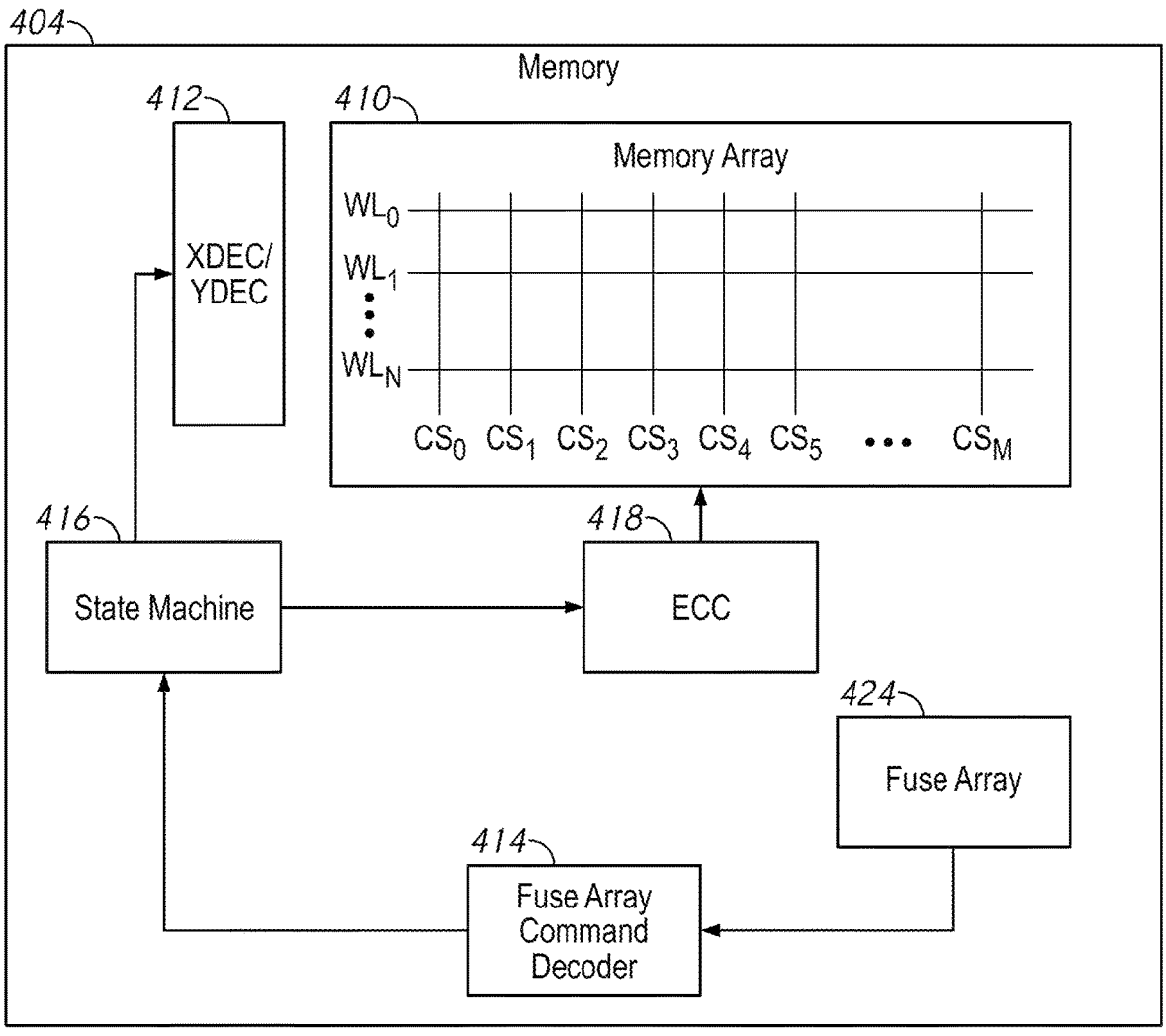
FIG. 4 is a block diagram of a memory according to some embodiments of the present disclosure.

FIG. 4 is a block diagram of a memory according to some embodiments of the present disclosure. The memory 404 may be included in device 100 and/or memory 204 in some embodiments. The memory 404 generates and store per-row ECS information including recent information and baseline information. Further, the memory 404 may store baseline information in a fuse array and load the baseline information into the memory array 410. In some embodiments, the memory array 410 may be included in memory array 118 and/or memory array 210.

The memory 404 includes a fuse array 524 which may store the baseline error information for the memory array 410 on a per-row basis. In some embodiments, the fuse array maybe included in fuse array 134 and/or fuse array 224. In some embodiments, the per-row baseline information may be stored in the fuse array 424 as a key-value pair. The key-value pair may encode the row address and the number of code words with errors (e.g., the pRECS value). Typically, during testing, memory arrays, such as memory array 410, have few rows that include errors (e.g., defective memory cells). For example, less than 0.1% of rows may have errors for some memory types. Thus, in some embodiments, the fuse array 424 may only include baseline error information (e.g., the key-value pair) for rows with errors instead of all rows where most of the rows would be associated with a pRECS value of zero (e.g., no errors in the row). In some embodiments, the fuse array 424 may be included in a fuse array used for writing to unused redundant rows.

The memory 404 may include a fuse array command decoder 414 for decoding the baseline information stored in the fuse array 424. In some embodiments, the fuse array command decoder 414 may be included in command decoder 106 and/or array command decoder 136. The fuse array command decoder 414 may decode the key-value pairs as well as breaks in information related to rows with no baseline errors, banks, and the start and end of the baseline information in the fuse array 424. The fuse array command decoder 414 may send the decoded key-value pair (e.g., the address and the baseline pRECS value or other error count information) to a state machine 416. In some embodiments, each bank of the memory array 410 have a separate state machine 416, and the fuse array command decoder 414 may provide the decoded baseline information to the appropriate bank.

The state machine 416 may multiplex the row address into the row latches of the row decoder of the row and column decoders 412 and the baseline pRECS value to the appropriate main I/O lines for writing baseline pRECS value to the row associated with the row address. The state machine 416 may generate an activation signal ACT associated with the row address and a write signal associated with the baseline pRECS value. In some embodiments, writing the baseline information to the row may also trigger an ECC operation performed by an ECC circuit 418. In some embodiments, the ECC circuit 418 may be included in ECC circuit 120 and/or ECC circuit 216. The ECC circuit 418 may generate parity bits associated with the baseline pRECS value. Both the baseline pRECS value and the parity bits may be written to the array 410. For rows not included in the fuse array 424, the fuse array command decoder 414 and/or state machine 416 may cause a baseline pRECS value of zero to be written to the row.

In some embodiments, the loading of the baseline information stored in the fuse array 424 to the memory array 410 may be initiated during power up/initializing of the memory 404. In some embodiments, the loading of the baseline information may be triggered by enabling per-row ECS data storage (e.g., by programming an appropriate value in a mode register).

FIG. 5 shows an example grammar for programming the fuse array according to embodiments of the present disclosure. The grammar shown in FIG. 5 may be used to program a fuse array to store pre-row baseline error information, such as fuse array 424 and/or fuse array 134. Seventeen bits may be associated with the row address and four bits may be associated with the number of code words with errors (e.g., pRECS value). However, in other embodiments, other numbers of bits may be used to store the row address and/or pRECS. For example, six bits may be used to store a pRECS value. The number of bits used to store the pRECS value may be based, at least in part, on a number of code words in each word. In some embodiments, the number of bits used to store the pRECS value may be based, at least in part, on a threshold value for the number of code words with errors tolerated for a row. For example, while a row may include sixty-four code words (which would require six bits to store a pRECS value), if a threshold value for repairing the row is lower than sixty-four, fewer bits may be used to store the pRECS value because the row may be replaced prior to reaching an error in every single code word.

In some embodiments, such as the one shown in FIG. 5, row addresses may also be used to encode commands. When only baseline error information is stored for rows with a non-zero value of pRECS, any row address stored in the fuse array associated with a zero value may be understood by a decoder (e.g., decoder 414 and/or 136) to be a command or other information rather than a row address. In the example shown in FIG. 5, row addresses corresponding to row 34 associated with a zero pRECS value indicates a start command that causes the decoder to start decoding the data from the fuse array. Row address 35 with a zero pRECS value indicates the start of baseline information associated with a bank. Row addresses 0-32 associated with zero pRECS values may be used to encode the bank addresses. Row address 36 with a zero pRECS value indicates the end baseline information associated with the bank. Finally, row address 37 with a zero pRECS value indicates the end of the baseline information in the fuse array. The remaining addresses associated with non-zero pRECS values indicate the rows for the current bank and their associated pRECS values.

The fuse array may further store baseline error information for redundant rows. In some embodiments, this baseline information may also be loaded into the memory array. In the example shown in FIG. 5, Row address 38 with a zero pRECS value indicates the start of baseline information associated with the redundant rows and row address 39 with a zero pRECS value indicates the end baseline information associated with the redundant rows. The redundant rows may be referred to as PPR rows because they are mapped via execution of a PPR operation. The remaining addresses associated with non-zero pRECS values indicate the redundant rows and their associated pRECS values.

The addresses used for commands and the commands associated with said addresses are provided merely as examples. Other addresses may be used and/or the addresses may be associated with different commands in other embodiments. Further, additional or fewer commands may be encoded in other embodiments.

FIG. 6 shows an example programming of a fuse array according to embodiments of the present disclosure. The example programming of the fuse array shown in FIG. 6 uses the example grammar shown in FIG. 5. As shown in the first line, an initial row address and pRECS value may be 34 and 0, respectively, to indicate to a command decoder (e.g., fuse array command decoder 414 and/or array command decoder 136) to begin an operation for loading baseline error information (e.g., pRECS values) from the fuse array to a memory array. Following the start command is a start bank command indicated by a row address of 35 and a pRECS value of 0. This indicates the start of baseline error information for a new bank. The bank address is provided after the start bank command. In the example shown in FIG. 6, the address is for BANK 0. Note that pRECS value is still zero for the bank address, thus allowing the decoder to interpret the address as a bank address rather than a row address.

Following the bank address, row addresses and pRECS values are provided for rows in BANK0 that have code words with errors. The first row address is row 34 and has a pRECS value of 4. Note that row address 34 will not be confused for the start command because the pRECS value is a non-zero value. The next row in BANK0 with errors is the row corresponding to row 78, which has a pRECS value of seven. In the example shown in FIG. 6, only two rows in BANK0 had errors in their code words when the baseline error information was collected. However, more or fewer rows may have baseline error information in other examples. The command decoder may cause pRECS values of zeros to be written to memory cells assigned to the baseline error information for the remaining rows of BANK0.

After the last row with baseline error information for BANK 0 has been provided from the fuse array, a stop bank command is provided with row address 36 and a pRECS value of 0. A new start bank command and a new bank address, BANK 6 in this example, are provided, followed by row addresses and pRECS values for rows in BANK 6. In the example shown, only two banks have rows with non-zero pRECS values. More or fewer banks may have baseline error information in other examples. Once the baseline error information has been provided from all of the banks, a final stop bank command is provided, and the stop command is issued by providing a row address of 37 with a pRECS value of zero. This indicates that all of the baseline information for the memory array has been provided, and loading of the baseline information into the array is complete.

Optionally, baseline information for redundant rows may also be encoded in the fuse array. In the example shown in FIG. 6, another start command is issued followed by a start PPR command indicated by row address 38 with a pRECS value of 0. This informs the command decoder to decode the address differently as these addresses will be from redundant rows of a memory array rather than the "main" rows of the memory array. Similar to the "normal" operation, a start bank command and a bank address is issued (BANK 0 in this example). Redundant row addresses (e.g., PPR addresses) and associated pRECS values are then provided for the bank. In the example shown in FIG. 6, row address 12 and a pRECS value of 7 are provided. After all of the information for the rows of the bank are provided, a stop bank command is issued. While the example shown in FIG. 6 only includes one bank, in other examples, more or fewer banks may include baseline error information for redundant rows. Once all of the PPR baseline error information has been provided, a stop PPR command is issued by providing row address 39 with a pRECS value of zero. Finally, a stop command is issued to indicate all of the baseline information has been provided to the memory array.

Figure 7:
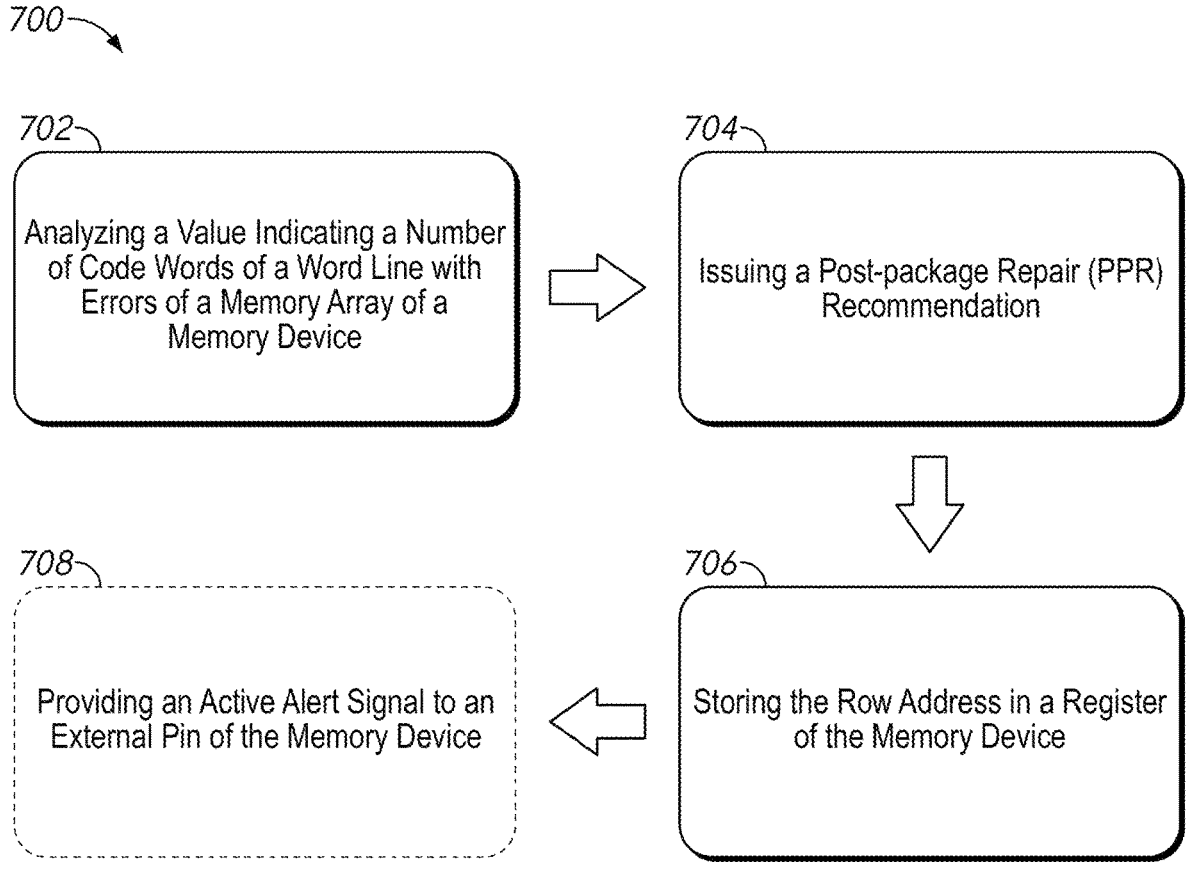
FIG. 7 is a flow chart of a method according to embodiments of the present disclosure.

FIG. 7 is a flow chart of a method according to embodiments of the present disclosure. In some embodiments, the method 700 shown in FIG. 7 may be performed in whole or in part by a memory device, such as device 100, memory 204, and/or memory 404.

At block 702, "analyzing a value indicating a number of code words of a word line with errors of a memory array of a memory device" may be performed. In some embodiments, analyzing the value may include comparing the value to a threshold value. In some embodiments, analyzing the value may include comparing the value to baseline error information. In some embodiments, the baseline error information indicates a number of code words of the word line with errors during a test operation. In some embodiments, analyzing the value may include comparing the value to a plurality of values. In some embodiments, the plurality of values indicate numbers of code words of the word line with errors during previous error correction and scrub operations.

At block 704, based on the analyzing, "issuing a post-package repair (PPR) recommendation" may be performed. In some embodiments, the PPR recommendation comprises a row address corresponding to the word line to be repaired. In some embodiments, the PPR recommendation is issued when the value is equal to or greater than the threshold value. In some embodiments, the PPR recommendation is issued when the value is greater than the baseline error information. In some embodiments, the PPR recommendation is issued when the value is greater than a most recent one of the plurality of values or is greater than an average of the plurality of values.

At block 706, "storing the row address in a register of the memory device" may be performed. In some embodiments, the register may be stored in a mode register.

Optionally method 700 may include block 708 where "providing an active alert signal to an external pin of the memory device" is performed.

Figure 8:
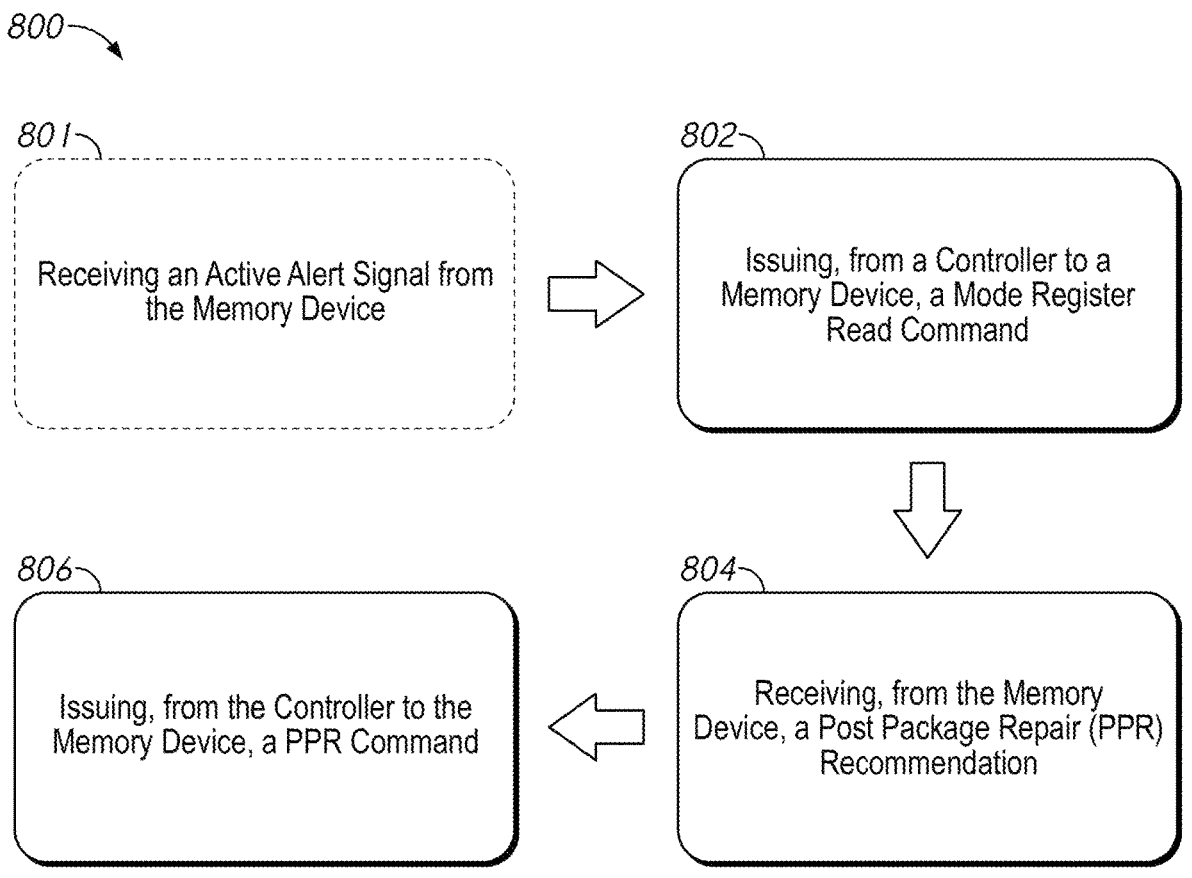
FIG. 8 is a flow chart of a method according to embodiments of the present disclosure.

FIG. 8 is a flow chart of a method according to embodiments of the present disclosure. In some embodiments, the method 800 shown in FIG. 8 may be performed in whole or in part by a controller, such as controller 101 and/or controller 202.

At block 802, "issuing, from a controller to a memory device, a mode register read command" may be performed. In some embodiments, the controller issues the mode register read command periodically. Optionally, method 800 further includes "receiving an active alert signal from the memory device" as indicated by block 801. In some of these embodiments, the mode register read command is issued responsive to receiving the active alert signal.

At block 804, "receiving, from the memory device, a post package repair (PPR) recommendation" may be performed.

In some embodiments, the PPR recommendation may include a row address stored in the mode register.

At block 806, "issuing, from the controller to the memory device, a PPR command" may be performed. The PPR command may cause a word line associated with the row address to be remapped to a redundant row of the memory device.

Optionally method 800 may further include receiving per-row error information from the memory device and/or receiving per-row baseline error information from the memory device.

FIG. 9 is a flow chart of a method according to embodiments of the present disclosure. In some embodiments, the method 900 shown in FIG. 9 may be performed in whole or in part by a memory device, such as device 100, memory 204, and/or memory 404.

At block 902, "performing a first error correction and scrub operation on a memory array" may be performed.

At block 904, "determining a number of code words with errors for individual ones of a plurality of word lines of the memory array" may be performed.

At block 906, "writing a first plurality of values indicating the number of code words with errors for individual ones of the plurality of word lines to corresponding ones of the plurality of word lines" may be performed.

At block 908, "performing a second error correction and scrub operation on the memory array" may be performed.

At block 910 "determining the number of code words with errors for individual ones of the plurality of word lines of the memory array" may be performed.

At block 912, "writing a second plurality of values indicating the number of code words with errors for individual ones of the plurality of word lines to corresponding ones of the plurality of word lines" may be performed. The first plurality of values and the second plurality of values may be written to different memory cells of the plurality of word lines.

In some embodiments, method 900 may further include "writing data to at least one of the plurality of word lines" as indicated by block 914. The data may be written to different memory cells of the plurality of word lines than the first plurality of values and the second plurality of values.

In some embodiments, method 900 may further include "writing metadata to at least one of the plurality of word lines" as indicated by block 916. The metadata may be written to different memory cells of the plurality of word lines than the first plurality of values and the second plurality of values. In some embodiments, the metadata is written to a plurality of memory cells associated with a same column select as memory cells storing the first plurality of values, the second plurality of values, or both. In some embodiments, at least some of the metadata is written to a different column plane than a column plane including the first plurality of values, the second plurality of values, or both.

In some embodiments, method 900 may further include "writing baseline error information to individual ones of the plurality of word lines" as indicated by block 918. The baseline error information may be written to different memory cells of the plurality of word lines than memory cells storing the first plurality of values and the second plurality of values. In some embodiments, performing a testing operation on the memory array to acquire the baseline error information may be performed, and the baseline error information comprises the number of code words with errors for individual ones of the plurality of word lines of the memory array. In some embodiments, the testing operation is performed prior to the first error correction and scrub operation.

Figure 10:
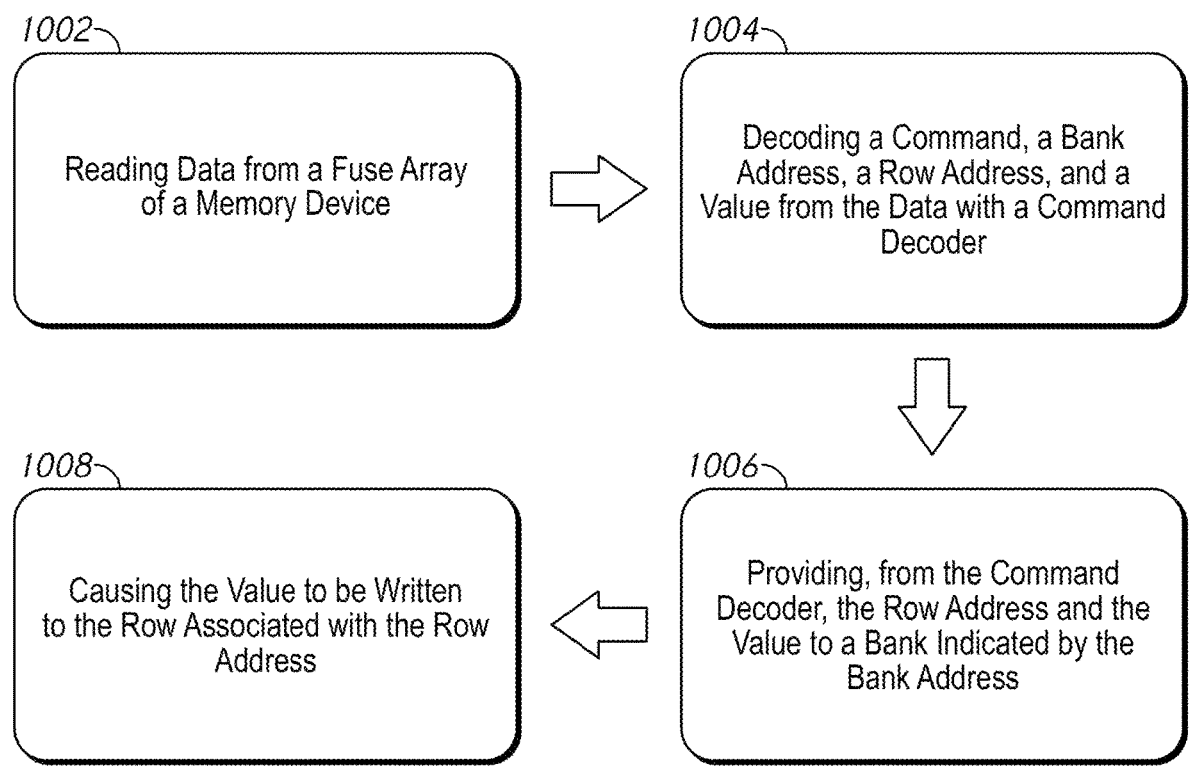
FIG. 10 is a flow chart of a method according to embodiments of the present disclosure.

FIG. 10 is a flow chart of a method according to embodiments of the present disclosure. In some embodiments, the method 1000 shown in FIG. 10 may be performed in whole or in part by a memory device, such as device 100, memory 204, and/or memory 404.

At block 1002 "reading data from a fuse array of a memory device" may be performed. In some embodiments, the data may be read from the fuse array by a command decoder.

At block 1004, "decoding a command, a bank address, a row address, and a value from the data with a command decoder" may be performed. In some embodiments, the value indicates a number of code words including errors of a row associated with the row address. In some embodiments, the command is encoded in the fuse array as a second row address and a second value equal to zero. In some embodiments, the command comprises a start command, a start bank command, a stop command, or a stop bank command. In some embodiments, In some embodiments, the bank address is encoded as an address and a second value equal to zero. In some embodiments, the row address indicates a redundant row. In some embodiments, the command comprises a start redundant row command or a stop redundant row command.

At block 1006, "providing, from the command decoder, the row address and the value to a bank indicated by the bank address" may be performed.

At block 1008, "causing the value to be written to the row associated with the row address" may be performed. In some embodiments, the row address and the value are provided to a state machine associated with the bank, and the state machine causes the value to be written to the row associated with the row address.

Optionally, in some embodiments, prior to block 1002 "powering up the memory device prior to the reading of the data from the fuse array" may be performed as indicated by block 1001.

The systems, methods, and apparatuses disclosed herein may allow for storage of both recent and baseline error information, particularly per-row error information in the memory, for example, in the memory array and/or a fuse array. The systems, methods, and apparatuses disclosed herein may allow for analysis of word lines to detect degradation (e.g., increase in a number of code words with errors) of word lines. The systems, methods, and apparatuses disclosed herein may allow for the memory to provide recommendations (e.g., to a controller) as to when a word line should be repaired (e.g., remapped to a redundant word line). The techniques disclosed herein may provide for more robust error management as well as reducing over-use of the PPR command replacing word lines that do not require repair. This may delay or eliminate "running out" of redundant rows available to repair defective word lines.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a memory array comprising a plurality of word lines configured to store a plurality of code words;
a mode register;
an error correction code (ECC) circuit configured to detect and correct errors in the plurality of code words;
an error correction and scrub (ECS) circuit configured to:
receive an active detection signal from the ECC circuit when the ECC circuit detects an error in a code word of the plurality of code words of a word line of the plurality of word lines and update a value indicative of a number of code words of the plurality of code words with errors for the word line; and
analyze the value and provide to the mode register a row address associated with the word line based on the analysis, wherein the mode register is configured to store the row address.

2. The apparatus of claim 1, wherein the mode register is configured to provide the row address to a controller responsive to a mode register read command.

3. The apparatus of claim 1, further comprising an external pin, wherein the mode register is configured to provide an active alert signal to the external pin based on receiving the row address from the ECS circuit.

4. The apparatus of claim 1, further comprising an external pin, wherein the ECS circuit is configured to provide an active alert signal to the external pin based on the analysis.

5. The apparatus of claim 1, further comprising a fuse array configured to store baseline error information, wherein the ECS circuit is further configured to analyze the value and the baseline error information.

6. The apparatus of claim 1, wherein the ECS circuit is further configured to analyze a plurality of values, wherein each of the plurality of values indicate the number of code words of the plurality of code words with errors for the word line, wherein the value is one of the plurality of values.

7. The apparatus of claim 1, wherein the ECS circuit causes the value to be written to the memory array.

* * * * *